(12) United States Patent
Eissa

(10) Patent No.: US 6,383,928 B1
(45) Date of Patent: May 7, 2002

(54) POST COPPER CMP CLEAN

(75) Inventor: Mona M. Eissa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/652,286

(22) Filed: Aug. 31, 2000

Related U.S. Application Data

(60) Provisional application No. 60/152,033, filed on Sep. 2, 1999.

(51) Int. Cl.$^7$ ................................................. H01L 21/44
(52) U.S. Cl. ...................... 438/687; 438/633; 438/692
(58) Field of Search ................................. 438/687, 631, 438/633, 692, 626

(56) References Cited

U.S. PATENT DOCUMENTS 6,165,956 A * 12/2000 Zhang et al. ............... 510/175

FOREIGN PATENT DOCUMENTS

JP  2000091278  * 3/2000  ......... H01L/21/304

* cited by examiner

*Primary Examiner*—Charles Bowers
*Assistant Examiner*—Thanh Nguyen
(74) *Attorney, Agent, or Firm*—Jacqueline J. Garner; W. James Brady, III; Frederick J. Telecky, Jr.

(57) ABSTRACT

A non-contact post CMP clean-up process. A corrosion inhibitor is used to protect the copper (118) surface to prevent an electrochemical reaction between the p-well and n-well areas. A multi-step wet chemistry is used to clean all exposed surfaces without etching more than 100 Å of the dielectric (110), copper (118), or liner (116). The first step uses a basic solution and a surfactant (124). The second step uses a diluted HF solution (126) and the third step uses an organic acid solution (128).

21 Claims, 4 Drawing Sheets

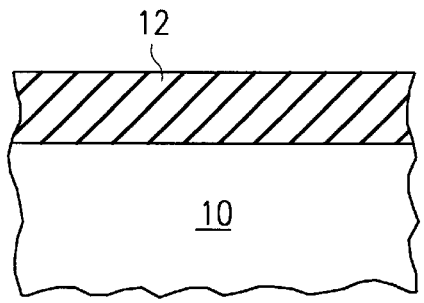
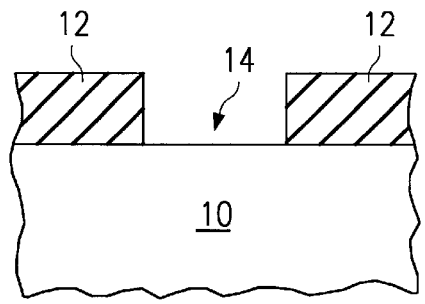
FIG. 1A
(PRIOR ART)
FIG. 1B
(PRIOR ART)
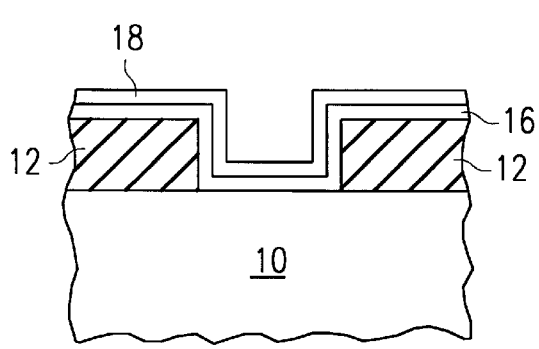
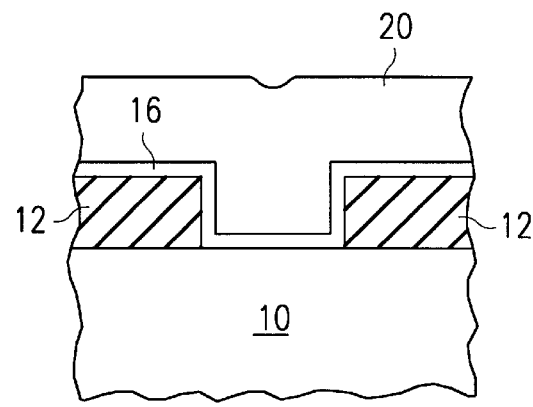
FIG. 1C
(PRIOR ART)
FIG. 1D
(PRIOR ART)
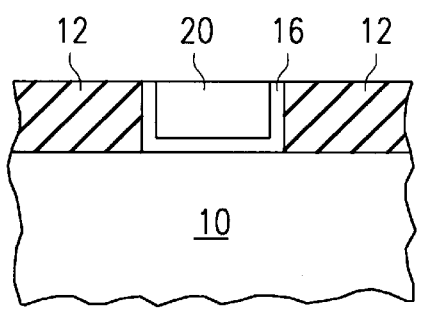
FIG. 1E
(PRIOR ART)

POST COPPER CMP CLEAN

This application claims priority under 35 USC §119(e)(1) of provisional application No. 60/152,033 filed Sep. 2, 1999.

FIELD OF THE INVENTION

The invention is generally related to the field of forming copper interconnects in semiconductor devices and more specifically to a post-copper CMP clean process.

BACKGROUND OF THE INVENTION

As integrated circuits become more and more dense, the width of interconnect layers that connect transistors and other devices of the integrated circuit to each other is reduced. As the width decreases, the resistance increases. Accordingly, many companies are looking to switch from a traditional aluminum interconnect to a copper interconnect. Unfortunately, copper is very difficult to etch in a semiconductor process flow. Therefore, damascene processes have been proposed to form copper interconnects.

A typical damascene process consists of forming an interlevel dielectric 12 first over a semiconductor body 10, as shown in FIG. 1A. The interlevel dielectric 12 is then patterned and etched to remove the dielectric material from the areas 14 where the interconnect lines are desired, as shown in FIG. 1B. In a dual damascene process, via holes are also formed at this time. Referring to FIG. 1C, a barrier layer 16 is then deposited over the structure including over the dielectric 12 and in the areas 14 where the dielectric has been removed. A copper seed layer 18 is then formed over the barrier layer 16. The copper layer 20 is then formed from the seed layer 18 using, for example, an electroplating process, as shown in FIG. 1D. Chemical-mechanical polishing (CMP) is then used to remove the excess copper and planarize the copper 20 with the top of the interlevel dielectric layer 12, as shown in FIG. 1E.

The copper CMP is a very critical step in a dual damascene process. Most Cu CMP slurries are aluminum based. Aluminum based slurries are very hard to remove. The Cu CMP process leaves residue, slurry particles, metal contamination and Cu-by products on the surface of the metal lines and IMD/ILD surface. Prior art post copper CMP clean processes use a scrubber that contacts each wafer in a single wafer process environment. Due to the single wafer process, the prior art has low throughput. The scrubber process also utilizes consumables, such as brushes. Furthermore, Cu is a soft metal that is very easily scratched. Accordingly, a non-contact, lower cost/high throughput post CMP clean-up process is needed.

SUMMARY OF THE INVENTION

The invention is a non-contact post CMP clean-up process. A corrosion inhibitor is used to protect the copper surface to prevent an electrochemical reaction between the p-well and n-well areas while polishing. A multi-step wet chemistry is used to clean all exposed surfaces without etching more than 100 Å of the copper, liner, or dielectric. The wet clean chemistry is a batch process that allows high throughput and is cost effective.

An advantage of the invention is providing a non-contact, high throughput, cost effective post-copper CMP clean-up process.

This and other advantages will be apparent to those of ordinary skill in the art having reference to the specification in conjunction with the drawings.

BRIEF DESCRIPTION OF THE DRAWINGS

In the drawings:

FIGS. 1A–1C are cross-sectional diagrams of a prior art damascene process; and

DETAILED DESCRIPTION OF THE EMBODIMENTS

The invention will now be described in conjunction with dual damascene copper interconnect process. It will be apparent to those of ordinary skill in the art that the benefits of the invention may be applied to copper CMP in general and are not limited to the disclosed embodiment.

Figure 2A:
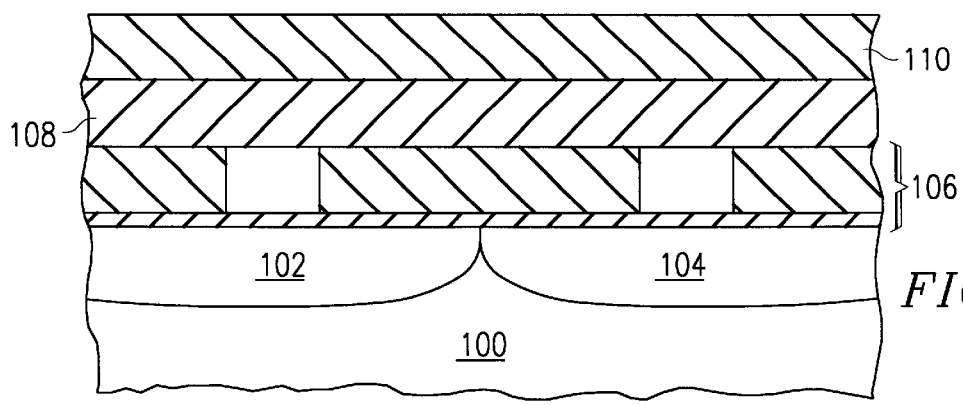
FIGS. 2A–2H are cross-sectional diagrams of a copper interconnect formed according to an embodiment of the invention at various stages of fabrication.

In a dual damascene process, after the formation of a first interconnect level 106 over a semiconductor body 100, an interlevel dielectric (ILD) 108 is deposited, as shown in FIG. 2A. The semiconductor body 100 will typically have transistors and other devices formed therein. In a CMOS process, some transistors (NMOS) will be formed in a p-well region 102 of the semiconductor body and other transistors (PMOS) will be formed in a n-well region 104.

A intrametal dielectric (IMD) 110 is formed over the ILD 108. ILD 108 and IMD 110 may comprise the same or different materials, as is known in the art. Each layer may additionally comprise multiple dielectric layers. For example, ILD 108 and IMD 110 may comprise one or more of the following: TEOS (tetraethyoxysilane), FSG (fluorine doped silicate glass), and other low-k dielectric such as OSG (organic silicate glass) films and SiLK™. SiLK™ is a thermoset organic polymer manufactured by Dow Chemical Company.

Figure 2B:
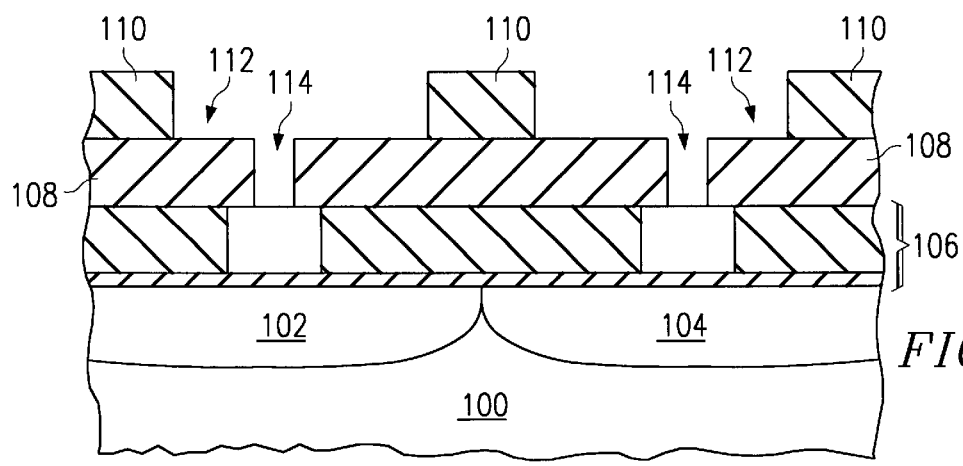

Referring to FIG. 2B, trench 112 is formed in IMD 110 and a via 114 is formed in ILD 108. Via 114 will provide connection between metal interconnect layers. Copper interconnect lines are subsequently formed in trench 112.

Figure 2C:
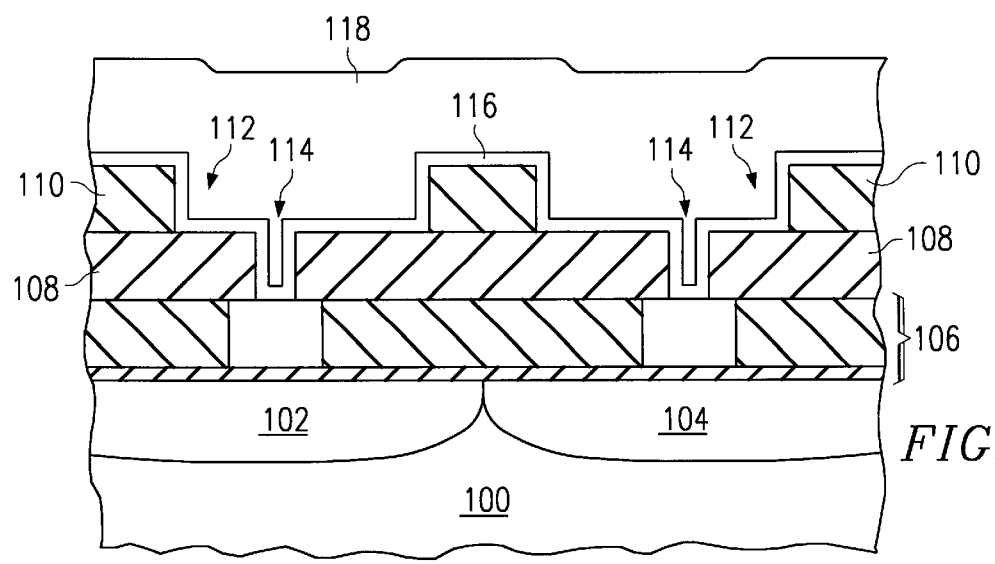

Next, liner 116 and copper 118 are formed, as shown in FIG. 2C. Liner 116 may, for example, comprise TaN, or Ta, or TiN. Liner 116 is deposited over IMD 110, including in trench 112 and via 114. Copper 118 is then formed. Typically, a copper seed layer is deposited and an electroplating process is used to over fill the trench 112.

Figure 2D:
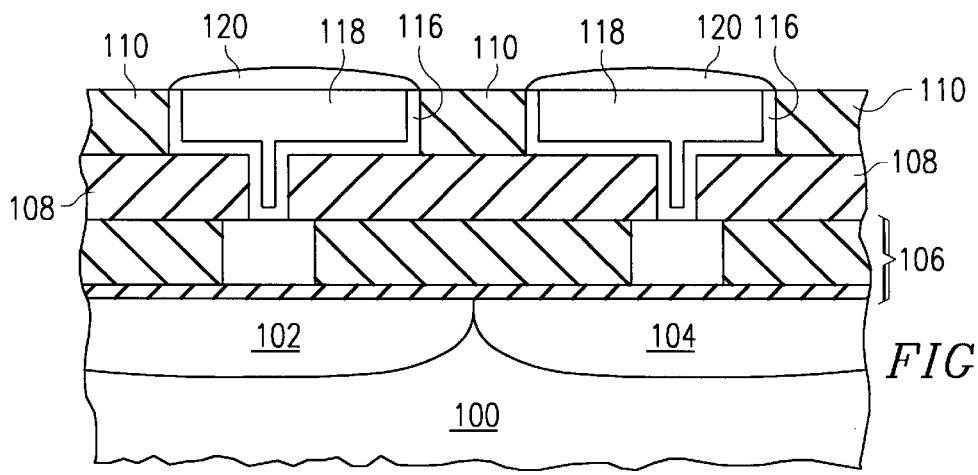

Cu CMP is performed next to planarize the structure and remove unwanted copper 118 and liner 116 from over IMD 110. The result is shown in FIG. 2D. An appropriate slurry, such as an aluminum-based slurry, is used. After polishing, the wafers are put in a polish tank. Typically, the polish tank is filled with deionized water (DIW). An acidic media may alternatively be used. Corrosion is known to occur in these tanks. Specifically, an oxidation reduction reaction between the copper lines over the p-wells and copper lines over the n-well may occur. This interaction is induced by light and it is proportional to the time of immersion in the DIW. This problem can be solved by having a cluster tool. However, cluster tools tend to be very expensive and very large.

Therefore, according to the invention, a corrosion inhibitor is added to the polish tank. The preferred embodiment of the invention uses a terizole, such as BTA (beuzatriazole), for the corrosion inhibitor. As shown in FIG. 2D, the corrosion inhibitor forms a compound 120 over the copper to passivate the copper surface and prevent corrosion. The corrosion inhibitor also prevents $NH_3$ from attaching the copper surface during the cleaning process.

As a result of the Cu CMP process, residue, slurry particles, metal contaminants and Cu by-products remain on the surface of copper 118 and IMD 110. Therefore, a multi-step clean-up process is performed using a wet chemistry instead of a scrubber. The wafers are placed in a hood-type chamber. This is a batch system that can process many wafers (e.g., 24 wafers/run) simultaneously. More than 75 wafers/hour can be processed. Accordingly, throughput is greatly improved. The hood is covered with an opaque material to prevent light from entering the chamber. A dark environment prevents diode-induced corrosion. Using a wet chemistry (non-contact) process for clean up instead of a scrubber, reduces the amount and cost of consumables.

Figure 2E:
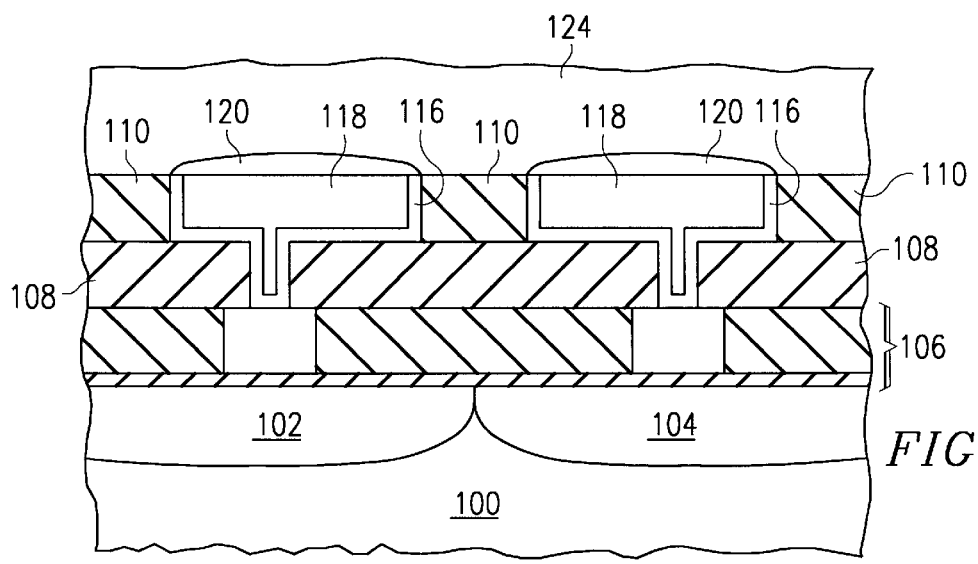

The first step uses a basic solution and a surfactant, 124, as shown in FIG. 2E. If desired, an optional rinse with megasonic may be performed prior to introducing these chemicals. The basic solution may comprise $NH_4OH$ or TMAH (tetramethylammonium hydroxide) at less than 0.1% wt. The surfactant may be on the order of 0.1% (e.g., 0.5 to 2%) surfactant. This step is used to remove slurry particles. The mixture of basic solution and surfactant may be used for a duration in the range of 3–5 minutes with megasonic. Both the surfactant and the corrosion inhibitor help protect the copper surface from $NH_3$ attack. As discussed above, the corrosion inhibitor forms a compound 120 on the copper surface that prevents or slows the $NH_3$ etching. A quick-dump-rise (QDR) is then performed.

Figure 2F:
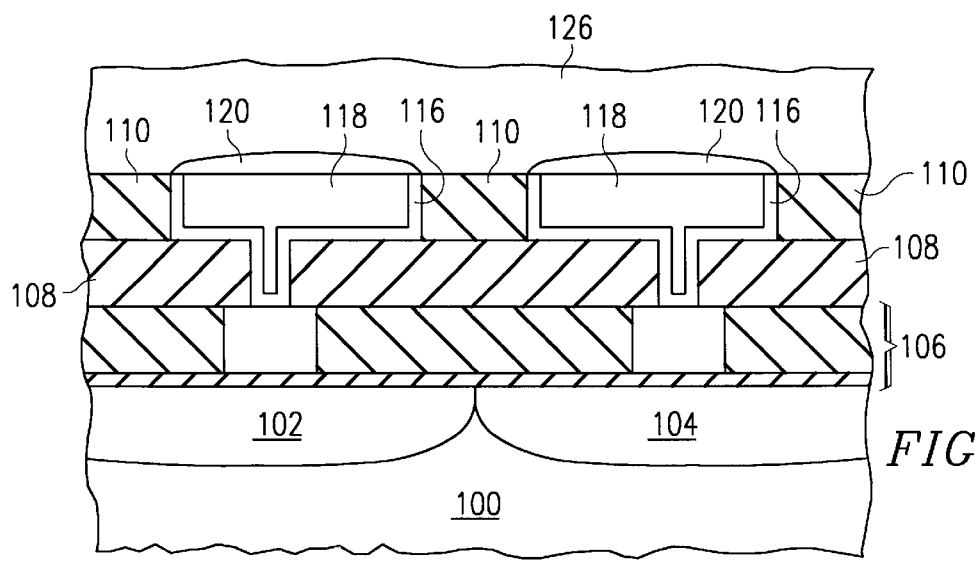

The second step uses a dilute HF solution 126, as shown in FIG. 2F. For example, a 1:500 to 1:100 dilution may be used for a duration in the range of 10–40 sec. The purpose of the second step is to remove metal contamination. This step is followed by a QDR with megasonic.

Figure 2G:
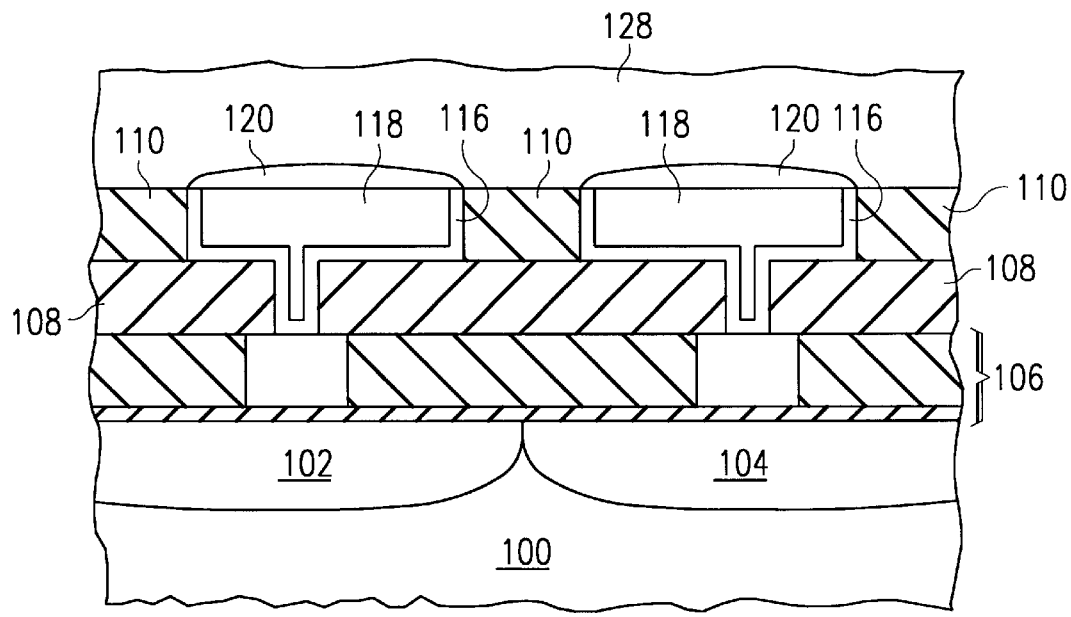

The last step uses an organic acid solution 128 to remove copper by-products, as shown in FIG. 2G. Any copper remaining on the surface is removed along with an Cu-oxide. The organic acid may, for example, comprise Citric acid or a mixture of organic acids. The concentration is less than 0.2% organic acid. The duration is less than 5 min with megasonic. This may be followed by a QDR.

The above wet clean chemistries are compatible with many lower k dielectrics currently being investigated. The wet chemistries are compatible with FSG, TEOS, OSG films, and SiLK™. For example, when FSG is used, less than 100 Å of FSG is removed during the above clean-up process. In addition, less that $5E10$ $atm/cm^2$ of copper remains of the FSG surface and less than 10 Å of $Cu_xO_y$ remains.

Figure 2H:
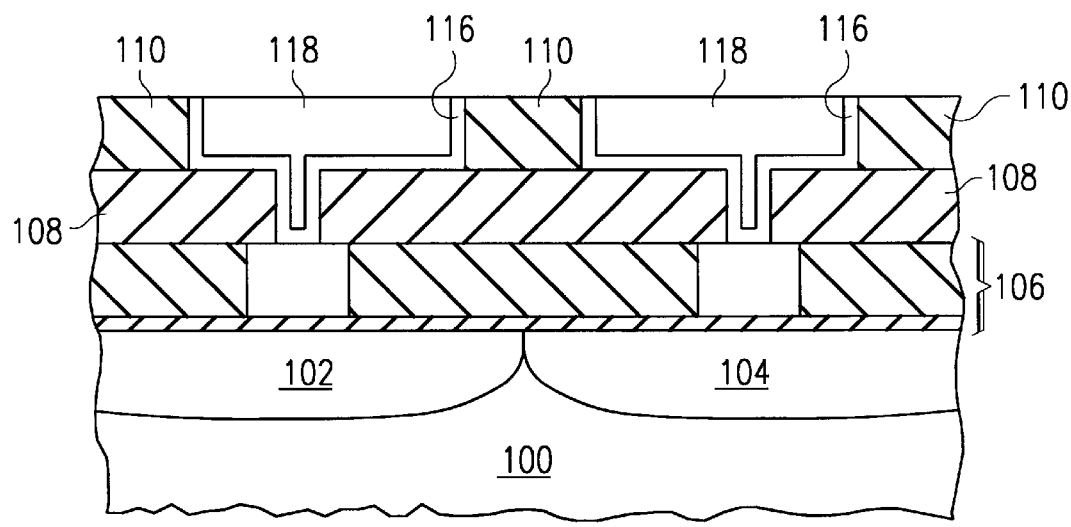

After clean up, the wafers are dried in a spin dryer without heat. A vapor or IPA (Isopropanol alcohol) spray can be applied to dry the wafers in a shorter amount of time. The IPA may be applied during the last rinse instead of spin drying the wafers. By implementing the IPA, any dryness and particle removal are enhanced, as shown in FIG. 2H.

Processing may then continue to form any subsequent metal interconnect layers. The above process may be used for any copper interconnect layer. It is not limited to the second interconnect layer as described above.

If desired, the above process may be performed in a scrubber. The basic solution and surfactant may be applied at a first brush and the diluted HF and organic acid may be applied at a second brush. A nozzle may be added to apply IPA during a spin rinse dry step. After a DIW rinse, IPA is applied to the wafer through the added nozzle.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit, comprising the steps of:
   chemically-mechanically polishing a copper film formed on a semiconductor wafer;
   performing a multi-step clean-up process using a wet chemistry, comprising the steps of:
      providing a basic solution and a surfactant to a surface created by said chemically-mechanically polishing step in a first step;
      providing a diluted HF solution to said surface in a distinct second step; and
      providing an organic acid to said surface in a distinct third step.

2. The method of claim 1, further comprising the step of placing said wafer in a solution comprising a corrosion inhibitor after said chemically-mechanically polishing step.

3. The method of claim 1, wherein said multi-step clean-up process is performed in a dark environment.

4. The method of claim 1, wherein said multi-step clean-up process is performed in a hood covered to prevent light from reaching said wafer.

5. The method of claim 1, wherein said basic solution comprises $NH_4OH$.

6. The method of claim 1, wherein said basic solution comprises TMAH.

7. The method of claim 1, wherein said organic acid comprises citric acid.

8. The method of claim 1, wherein said organic acid comprises a mixture of organic acids.

9. The method of claim 1, further comprising the step of applying IPA to said wafer after said step of applying said organic acid.

10. The method of claim 1, further comprising the following steps:
    rinsing said wafer before said multi-step clean up process;
    rinsing said wafer after the step of providing a basic solution and surfactant;
    rinsing said wafer after said step of providing a diluted HF solution; and
    rinsing said wafer after said step of applying the organic acid.

11. The method of claim 1, wherein said multi-step clean-up process is performed in a scrubber wherein said basic solution and surfactant are applied at a first brush and said diluted HF solution and organic acid are applied at a second brush.

12. The method of claim 11, further comprising the steps of rinsing with deionized water and then spraying isopropanal alcohol through an added nozzle during a spin rinse dry step.

13. A method of forming an integrated circuit, comprising the steps of:
    forming a dielectric layer over a semiconductor wafer;
    forming a trench in said dielectric layer;
    forming a copper film in said trench and over said dielectric layer;
    chemically-mechanically polishing said copper film to expose a surface of said dielectric layer;
    placing said wafer in a solution comprising a corrosion inhibitor;
    performing a multi-step clean-up process using a wet chemistry in a dark environment, comprising the steps of:

providing a basic solution and a surfactant to said surface;

rinsing said surface;

providing a diluted HF solution to said surface;

rinsing said surface;

providing an organic acid to said surface; and rinsing said surface.

14. The method of claim 13, wherein said corrosion inhibitor comprises terizole.

15. The method of claim 13, wherein said corrosion inhibitor comprises BTA.

16. The method of claim 13, wherein said multi-step clean-up process is performed in a hood covered to prevent light from reaching said wafer.

17. The method of claim 13, wherein said basic solution comprises $NH_4OH$.

18. The method of claim 13, wherein said basic solution comprises TMAH.

19. The method of claim 13, wherein said organic acid comprises citric acid.

20. The method of claim 13, further comprising the step of applying IPA to said wafer after said step of applying said organic acid during said rinsing step.

21. A method of forming an integrated circuit, comprising the steps of:

chemically-mechanically polishing a copper film formed on a semiconductor wafer;

performing a multi-step non-contact clean-up process using a wet chemistry, comprising the steps of:

providing a basic solution and a surfactant to a surface created by said chemically-mechanically polishing step;

providing a diluted HF solution to said surface; and providing an organic acid to said surface.

* * * * *